(12) United States Patent
Park et al.

(10) Patent No.: US 9,774,319 B2
(45) Date of Patent: Sep. 26, 2017

(54) PHASE DETECTION CIRCUIT (71) Applicant: SK hynix Inc., Icheon-si Gyeonggi-do (KR)

(72) Inventors: Myeong Jae Park, Icheon-si (KR); Kyung Hoon Kim, Icheon-si (KR); Kyu Young Kim, Icheon-si (KR); Woo Yeol Shin, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/157,564

(22) Filed: May 18, 2016

(65) Prior Publication Data
US 2017/0179938 A1 Jun. 22, 2017

(30) Foreign Application Priority Data
Dec. 17, 2015 (KR) .................. 10-2015-0180718

(51) Int. Cl.
| H03D 13/00 | (2006.01) |
| H03K 5/15 | (2006.01) |
| H03K 5/24 | (2006.01) |
| H02M 3/07 | (2006.01) |
| G01R 25/08 | (2006.01) |
| G01R 23/02 | (2006.01) |
| H03K 19/21 | (2006.01) |

(52) U.S. Cl.
CPC .......... *H03K 5/1506* (2013.01); *G01R 23/02* (2013.01); *G01R 25/08* (2013.01); *H02M 3/07* (2013.01); *H03K 5/24* (2013.01); *H03K 19/21* (2013.01)

(58) Field of Classification Search
CPC .................................................. H03K 5/1506
See application file for complete search history.

(56) References Cited

U.S. PATENT DOCUMENTS

| 8,816,776 B2 | 8/2014 | Sindalovsky et al. |
| 2003/0223527 A1* | 12/2003 | Otomo ................. H03D 13/004 375/376 |

* cited by examiner

Primary Examiner — Daniel Puentes
(74) Attorney, Agent, or Firm — William Park & Associates Ltd.

(57) ABSTRACT

A phase detection circuit includes a sampling signal generation circuit configured to generate a plurality of sampling signals in response to a plurality of phase change clocks having different phases and data; a charging voltage generation circuit configured to compare the plurality of sampling signals, and change a voltage level of one charging voltage between a first charging voltage and a second charging voltage; and a comparison circuit configured to compare voltage levels of the first and second charging voltages, and generate a result signal.

19 Claims, 5 Drawing Sheets

PHASE DETECTION CIRCUIT

CROSS-REFERENCES TO RELATED APPLICATION

The present application claims priority under 35 U.S.C. §119(a) to Korean application number 10-2015-0180718, filed on Dec. 17, 2015, in the Korean Intellectual Property Office, which is incorporated herein by reference in its entirety.

BACKGROUND

1. Technical Field

Various embodiments generally relate to a semiconductor integrated circuit, and, more particularly, to a phase detection circuit.

2. Related Art

A semiconductor integrated circuit is configured to transmit and receive signals to and from an external circuit or is configured such that internal circuits transmit and receive signals to and from one another.

In order to increase an operation speed of a semiconductor integrated circuit when transmitting and receiving signals, the semiconductor integrated circuit is configured to transmit the signal synchronously with a clock or receive the signal by using the clock.

Transmitted and received signals and a clock should be synchronized at precise times. When the signals to be transmitted and received and the clock are not synchronized at precise times, the semiconductor integrated circuit may misoperate by receiving an erroneous signal.

Therefore, the semiconductor integrated circuit should not only include a circuit capable of correcting the case where the signals and the clock are not precisely synchronized, but the circuit should also include a phase detection circuit capable of detecting phase differences between the signals and the clock.

SUMMARY

In an embodiment, a phase detection circuit may include: a sampling signal generation circuit configured to generate a plurality of sampling signals in response to a plurality of phase change clocks having different phases and data; a charging voltage generation circuit configured to compare the plurality of sampling signals, and change a voltage level of one charging voltage between a first charging voltage and a second charging voltage; and a comparison circuit configured to compare voltage levels of the first and second charging voltages, and generate a result signal.

In an embodiment, a phase detection circuit may include: a first sampling circuit configured to sample data at a first sampling time, and output a first sampling signal; a second sampling circuit configured to sample the data at a second sampling time, and output a second sampling signal; a third sampling circuit configured to sample the data at a third sampling time, and output a third sampling signal; a charging voltage generation circuit configured to raise a voltage level of a first charging voltage according to whether the first and second sampling signals are the same or raise a voltage level of a second charging voltage according to whether the second and third sampling signals are the same; and a comparison circuit configured to compare the voltage levels of the first and second charging voltages, and generate a result signal.

DETAILED DESCRIPTION

Hereinafter, a phase detection circuit will be described below with reference to the accompanying drawings through various examples of embodiments.

Figure 1:
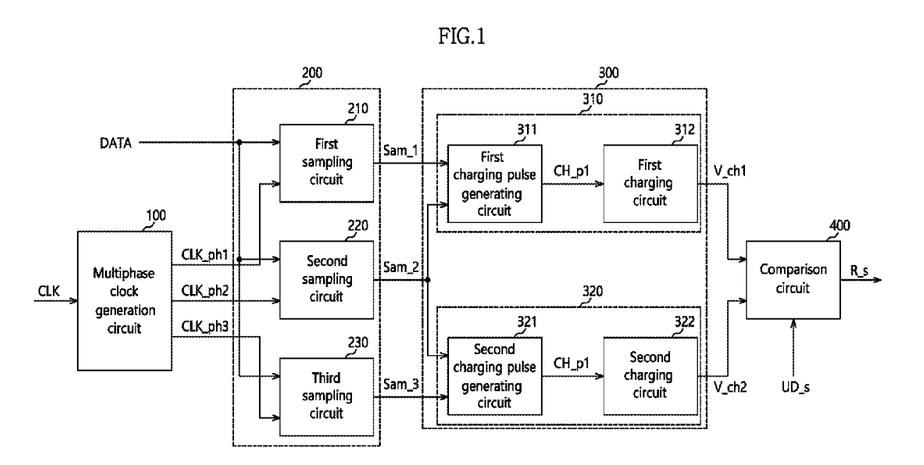
FIG. 1 is a configuration diagram illustrating a representation of an example of a phase detection circuit in accordance with an embodiment.

As shown in FIG. 1, a phase detection circuit in accordance with an embodiment may include a multiphase clock generation circuit 100, a sampling signal generation circuit 200, a charging voltage generation circuit 300, and a comparison circuit 400.

The multiphase clock generation circuit 100 may be inputted with a clock CLK, and generate first to third phase change clocks CLK_ph1, CLK_ph2 and CLK_ph3 which have different phases. For example, the multiphase clock generation circuit 100 may generate the first to third phase change clocks CLK_ph1, CLK_ph2 and CLK_ph3 such that the first phase change clock CLK_ph1 and the second phase change clock CLK_ph2 have a predetermined phase difference, and the second phase change clock CLK_ph2 and the third phase change clock CLK_ph3 have the same predetermined phase difference. In detail, the multiphase clock generation circuit 100 may generate the first to third phase change clocks CLK_ph1, CLK_ph2 and CLK_ph3 such that a phase difference between the first phase change clock CLK_ph1 and the second phase change clock CLK_ph2 is ¼ cycle of the clock CLK, and the phase difference between the second phase change clock CLK_ph2 and the third phase change clock CLK_ph3 is also ¼ cycle of the clock CLK. The multiphase clock generation circuit 100 may generate the first phase change clock CLK_ph1 which has the same phase as the clock CLK, generate the second phase change clock CLK_ph2 which has a phase difference of ¼ cycle with respect to the first phase change clock CLK_ph1, and generate the third phase change clock CLK_ph3 which has a phase difference of ¼ cycle with respect to the second phase change clock CLK_ph2.

The multiphase clock generation circuit 100 may generate the first to third phase change clocks CLK_ph1, CLK_ph2 and CLK_ph3 by delaying the clock CLK, and may generate the first to third phase change clocks CLK_ph1, CLK_ph2 and CLK_ph3 by phase-mixing the clock CLK with another clock having a different phase.

The sampling signal generation circuit 200 may sample a data signal, for example, data DATA, inputted in synchronization with the clock CLK, in response to the respective first to third phase change clocks CLK_ph1, CLK_ph2 and CLK_ph3, and output sampled results as first to third sampling signals Sam_1, Sam_2 and Sam_3. For example, the sampling signal generation circuit 200 may sample the data DATA in response to the first phase change clock CLK_ph1 and output a sampled result as the first sampling signal Sam_1, sample the data DATA in response to the second phase change clock CLK_ph2 and output a sampled result as the second sampling signal Sam_2, and sample the data DATA in response to the third phase change clock CLK_ph3 and output a sampled result as the third sampling signal Sam_3.

The sampling signal generation circuit 200 may include first to third sampling circuits 210, 220 and 230 inputted with the first to third phase change clocks CLK_ph1, CLK_ph2 and CLK_ph3 which are inputted in common with the data DATA.

The first sampling circuit 210 generates the first sampling signal Sam_1 in response to the data DATA and the first phase change clock CLK_ph1. For example, the first sampling circuit 210 samples the data DATA in response to the first phase change clock CLK_ph1, and outputs a sampled result as the first sampling signal Sam_1.

The second sampling circuit 220 generates the second sampling signal Sam_2 in response to the data DATA and the second phase change clock CLK_ph2. For example, the second sampling circuit 220 samples the data DATA in response to the second phase change clock CLK_ph2, and outputs a sampled result as the second sampling signal Sam_2.

The third sampling circuit 230 generates the third sampling signal Sam_3 in response to the data DATA and the third phase change clock CLK_ph3. For example, the third sampling circuit 230 samples the data DATA in response to the third phase change clock CLK_ph3, and outputs a sampled result as the third sampling signal Sam_3.

The charging voltage generation circuit 300 may generate a first charging voltage V_ch1 and a second charging voltage V_ch2 in response to the first to third sampling signals Sam_1, Sam_2 and Sam_3.

For example, the charging voltage generation circuit 300 compares the first to third sampling signals Sam_1, Sam_2 and Sam_3, and raises the voltage level of one of the first charging voltage V_ch1 and the second charging voltage V_ch2. In detail, the charging voltage generation circuit 300 compares the first and second sampling signals Sam_1 and Sam_2 and raises the voltage level of the first charging voltage V_ch1 when the first and second sampling signals Sam_1 and Sam_2 are the same, or compares the second and third sampling signals Sam_2 and Sam_3 and raises the voltage level of the second charging voltage V_ch2 when the second and third sampling signals Sam_2 and Sam_3 are the same.

The charging voltage generation circuit 300 may include a first comparison charging circuit 310 and a second comparison charging circuit 320.

The first comparison charging circuit 310 raises the voltage level of the first charging voltage V_ch1 and generates the first charging voltage V_ch1 when the first and second sampling signals Sam_1 and Sam_2 have different levels. The first comparison charging circuit 310 retains the voltage level of the first charging voltage V_ch1 when the first and second sampling signals Sam_1 and Sam_2 have the same level.

The first comparison charging circuit 310 may include a first charging pulse generating circuit 311 and a first charging circuit 312.

The first charging pulse generating circuit 311 compares the first and second sampling signals Sam_1 and Sam_2, and generates a first charging pulse CH_p1. For example, the first charging pulse generating circuit 311 generates the first charging pulse CH_p1 which is enabled during a predetermined time, when the first and second sampling signals Sam_1 and Sam_2 have different levels. The first charging pulse generating circuit 311 does not generate the first charging pulse CH_p1 when the first and second sampling signals Sam_1 and Sam_2 have the same level.

The first charging circuit 312 charges a capacitor during a time corresponding to the enable period of the first charging pulse CH_p1, and outputs a voltage charged in the capacitor as the first charging voltage V_ch1.

The second comparison charging circuit 320 raises the voltage level of the second charging voltage V_ch2 and generates the second charging voltage V_ch2 when the second and third sampling signals Sam_2 and Sam_3 have different levels. The second comparison charging circuit 320 retains the voltage level of the second charging voltage V_ch2 when the second and third sampling signals Sam_2 and Sam_3 have the same level.

The second comparison charging circuit 320 may include a second charging pulse generating circuit 321 and a second charging circuit 322.

The second charging pulse generating circuit 321 compares the second and third sampling signals Sam_2 and Sam_3, and generates a second charging pulse CH_p2. For example, the second charging pulse generating circuit 321 generates the second charging pulse CH_p2 which is enabled during the predetermined time, when the second and third sampling signals Sam_2 and Sam_3 have different levels. The second charging pulse generating circuit 321 does not generate the second charging pulse CH_p2 when the second and third sampling signals Sam_2 and Sam_3 have the same level.

The second charging circuit 322 charges a capacitor during a time corresponding to the enable period of the second charging pulse CH_p2, and outputs a voltage charged in the capacitor as the second charging voltage V_ch2.

The comparison circuit 400 may generate a result signal R_s in response to the voltage levels of the first and second charging voltages V_ch1 and V_ch2. For example, the comparison circuit 400 may compare the voltage levels of the first and second charging voltages V_ch1 and V_ch2, and generate the result signal R_s. In detail, the comparison circuit 400 enables the result signal R_s when the voltage level of the first charging voltage V_ch1 is the higher of the first and second charging voltages V_ch1 and V_ch2. The comparison circuit 400 disables the result signal R_s when the voltage level of the second charging voltage V_ch2 is the higher of the first and second charging voltages V_ch1 and V_ch2. The comparison circuit 400 may be configured to compare the voltage levels of the first and second charging voltages V_ch1 and V_ch2 each time an update signal UD_s is enabled, and generate the result signal R_s. The update signal UD_s may be a signal which is cyclically enabled.

Figure 2:
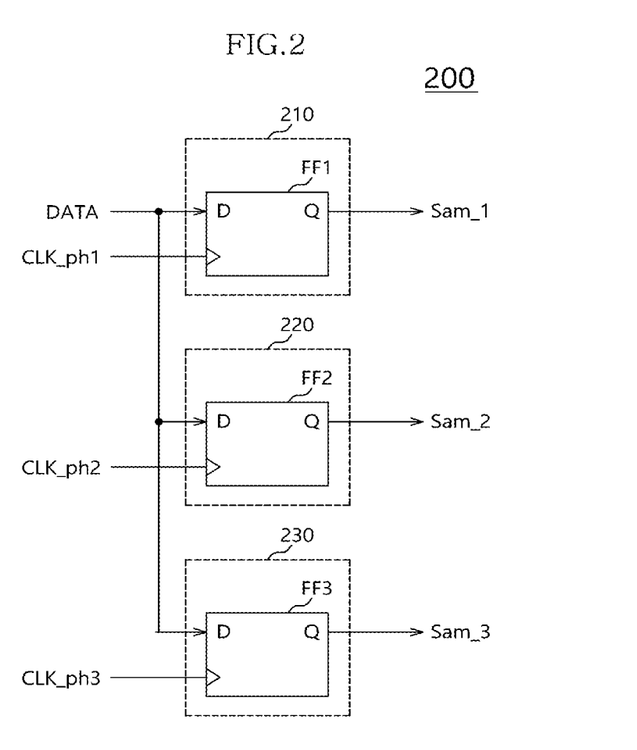
FIG. 2 is a configuration diagram illustrating a representation of an example sampling signal generation circuit shown in FIG. 1.

As shown in FIG. 2, the sampling signal generation circuit 200 may include the first to third sampling circuits 210, 220 and 230.

The first sampling circuit 210 may include a first flip-flop FF1. The first flip-flop FF1 is inputted with the first phase change clock CLK_ph1 and the data DATA, and outputs the first sampling signal Sam_1. Therefore, the first sampling circuit 210 may latch the data DATA at the rising timing of the first phase change clock CLK_ph1, and output latched data as the first sampling signal Sam_1.

The second sampling circuit 220 may include a second flip-flop FF2. The second flip-flop FF2 is inputted with the second phase change clock CLK_ph2 and the data DATA, and outputs the second sampling signal Sam_2. Therefore, the second sampling circuit 220 may latch the data DATA at the rising timing of the second phase change clock CLK_ph2, and output latched data as the second sampling signal Sam_2.

The third sampling circuit 230 may include a third flip-flop FF3. The third flip-flop FF3 is inputted with the third phase change clock CLK_ph3 and the data DATA, and outputs the third sampling signal Sam_3. Therefore, the third sampling circuit 230 may latch the data DATA at the rising timing of the third phase change clock CLK_ph3, and output latched data as the third sampling signal Sam_3.

Figure 3:
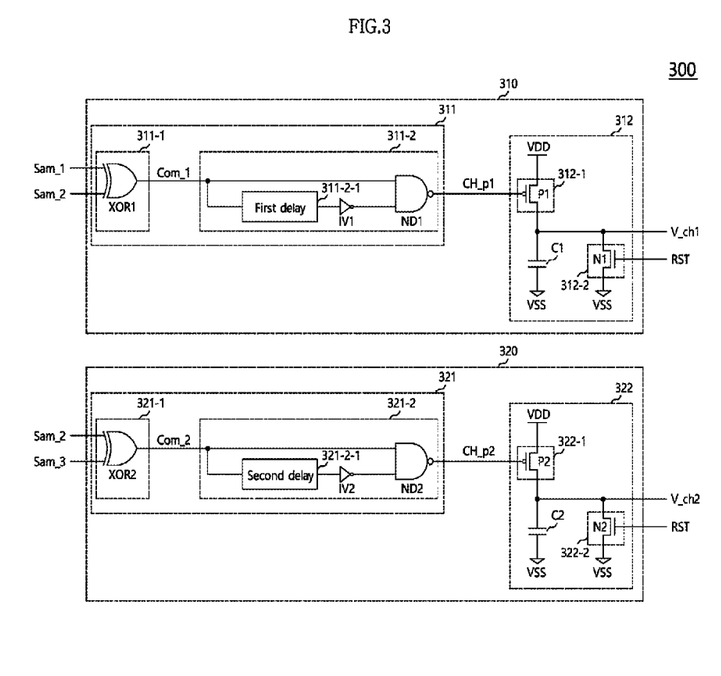
FIG. 3 is a configuration diagram illustrating a representation of an example charging voltage generation circuit shown in FIG. 1.

As shown in FIG. 3, the charging voltage generation circuit 300 may include the first and second comparison charging circuits 310 and 320.

The first comparison charging circuit 310 may include the first charging pulse generating circuit 311 and the first charging circuit 312.

The first charging pulse generating circuit 311 may include a first sample comparison circuit 311-1 and a first pulse generation circuit 311-2.

The first sample comparison circuit 311-1 compares the first and second sampling signals Sam_1 and Sam_2, and generates a first comparison signal Com_1. For example, the first sample comparison circuit 311-1 enables the first comparison signal Com_1 when the first and second sampling signals Sam_1 and Sam_2 have different levels. The first sample comparison circuit 311-1 disables the first comparison signal Com_1 when the first and second sampling signals Sam_1 and Sam_2 have the same level.

The first sample comparison circuit 311-1 may include a first XOR gate XOR1. The first XOR gate XOR1 is inputted with the first and second sampling signals Sam_1 and Sam_2, and outputs the first comparison signal Com_1.

The first pulse generation circuit 311-2 may generate the first charging pulse CH_p1 which is enabled during the predetermined time and the first charging pulse CH_p1 is generated each time the first comparison signal Com_1 is enabled.

The first pulse generation circuit 311-2 may include a first delay 311-2-1, a first inverter IV1, and a first NAND gate ND1. The first delay 311-2-1 is inputted with and delays the first comparison signal Com_1, and outputs a resultant signal. The first inverter IV1 is inputted with the output signal of the first delay 311-2-1. The first NAND gate ND1 is inputted with the first comparison signal Com_1 and the output signal of the first inverter IV1, and outputs the first charging pulse CH_p1.

The first charging circuit 312 charges a first capacitor C1 during the enable period of the first charging pulse CH_p1. A voltage charged in the first capacitor C1 is outputted as the first charging voltage V_ch1.

The first charging circuit 312 may include a first voltage application circuit 312-1 and the first capacitor C1.

The first voltage application circuit 312-1 charges a voltage in the first capacitor C1 during the enable period of the first charging pulse CH_p1. The first voltage application circuit 312-1 may include a first transistor P1. The first transistor P1 has a gate which is inputted with the first charging pulse CH_p1, a source which is applied with an external voltage VDD, and a drain to which one end of the first capacitor C1 is coupled.

The first capacitor C1 has one end to which the drain of the first transistor P1 is coupled and an other end which is applied with a ground voltage VSS. The first charging voltage V_ch1 is outputted from a node where the first transistor P1 and the first capacitor C1 are coupled. Moreover, the first charging circuit 312 may further include a first reset circuit 312-2. The first reset circuit 312-2 discharges the first capacitor C1 when a reset signal RST is enabled, and thereby resets the first charging voltage V_ch1 to an initialization level. The first reset circuit 312-2 may include a second transistor N1. The second transistor N1 has a gate which is inputted with the reset signal RST, a drain to which one end of the first capacitor C1 is coupled, and a source which is applied with the ground voltage VSS.

The second comparison charging circuit 320 may include the second charging pulse generating circuit 321 and the second charging circuit 322.

The second charging pulse generating circuit 321 may include a second sample comparison circuit 321-1 and a second pulse generation circuit 321-2.

The second sample comparison circuit 321-1 compares the second and third sampling signals Sam_2 and Sam_3, and generates a second comparison signal Com_2. For example, the second sample comparison circuit 321-1 enables the second comparison signal Com_2 when the second and third sampling signals Sam_2 and Sam_3 have different levels. The second sample comparison circuit 321-1 disables the second comparison signal Com_2 when the second and third sampling signals Sam_2 and Sam_3 have the same level.

The second sample comparison circuit 321-1 may include a second XOR gate XOR2. The second XOR gate XOR2 is inputted with the second and third sampling signals Sam_2 and Sam_3, and outputs the second comparison signal Com_2.

The second pulse generation circuit 321-2 may generate the second charging pulse CH_p2 which is enabled during the predetermined time and the second charging pulse CH_p2 is generated each time the second comparison signal Com_2 is enabled.

The second pulse generation circuit 321-2 may include a second delay 321-2-1, a second inverter IV2, and a second NAND gate ND2. The second delay 321-2-1 is inputted with and delays the second comparison signal Com_2, and outputs a resultant signal. The second inverter IV2 is inputted with the output signal of the second delay 321-2-1. The second NAND gate ND2 is inputted with the second comparison signal Com_2 and the output signal of the second inverter IV2, and outputs the second charging pulse CH_p2.

The second charging circuit 322 charges a second capacitor C2 during the enable period of the second charging pulse CH_p2. A voltage charged in the second capacitor C2 is outputted as the second charging voltage V_ch2.

The second charging circuit 322 may include a second voltage application circuit 322-1 and the second capacitor C2.

The second voltage application circuit 322-1 charges a voltage in the second capacitor C2 during the enable period of the second charging pulse CH_p2. The second voltage application circuit 322-1 may include a third transistor P2. The third transistor P2 has a gate which is inputted with the second charging pulse CH_p2, a source which is applied with the external voltage VDD, and a drain to which one end of the second capacitor C2 is coupled. The second capacitor C2 has one end to which the drain of the third transistor P2 is coupled and an other end which is applied with the ground voltage VSS. The second charging voltage V_ch2 is outputted from a node where the third transistor P2 and the second capacitor C2 are coupled. Moreover, the second charging circuit 322 may further include a second reset circuit 322-2. The second reset circuit 322-2 discharges the second capacitor C2 when the reset signal RST is enabled, and thereby resets the second charging voltage V_ch2 to an initialization level. The second reset circuit 322-2 may include a fourth transistor N2. The fourth transistor N2 has a gate which is inputted with the reset signal RST, a drain to which one end of the second capacitor C2 is coupled, and a source which is applied with the ground voltage VSS.

The operation of the phase detection circuit in accordance with the embodiment, configured as mentioned above, will be described below.

The clock CLK, and the data DATA synchronized with the clock CLK, are inputted to the phase detection circuit in accordance with the embodiment.

The multiphase clock generation circuit 100 is inputted with the clock CLK, and generates the first to third phase change clocks CLK_ph1, CLK_ph2 and CLK_ph3. The first to third phase change clocks CLK_ph1, CLK_ph2 and CLK_ph3 have a predetermined phase difference.

The sampling signal generation circuit 200 outputs the first to third sampling signals Sam_1, Sam_2 and Sam_3 by synchronizing the data DATA with the respective first to third phase change clocks CLK_ph1, CLK_ph2 and CLK_ph3. In detail, the sampling signal generation circuit 200 latches the data DATA at the rising timing of the first phase change clock CLK_ph1, and outputs a latched result as the first sampling signal Sam_1. The sampling signal generation circuit 200 latches the data DATA at the rising timing of the second phase change clock CLK_ph2, and outputs a latched result as the second sampling signal Sam_2. The sampling signal generation circuit 200 latches the data DATA at the rising timing of the third phase change clock CLK_ph3, and outputs a latched result as the third sampling signal Sam_3. The sampling signal generation circuit 200 includes the first to third sampling circuits 210, 220 and 230, and each of the sampling circuits 210, 220 and 230 latches the data DATA at the rising timing of a phase change clock inputted thereto and outputs a latched result as a sampling signal.

The charging voltage generation circuit 300 compares the first to third sampling signals Sam_1, Sam_2 and Sam_3, and raises the first charging voltage V_ch1 or the second charging voltage V_ch2. For example, the charging voltage generation circuit 300 compares the first and second sampling signals Sam_1 and Sam_2 and raises the voltage level of the first charging voltage V_ch1, or compares the second and third sampling signals Sam_2 and Sam_3 and raises the voltage level of the second charging voltage V_ch2.

The charging voltage generation circuit 300 includes the first comparison charging circuit 310 which compares the first and second sampling signals Sam_1 and Sam_2 and raises the voltage level of the first charging voltage V_ch1, and the second comparison charging circuit 320 which compares the second and third sampling signals Sam_2 and Sam_3 and raises the voltage level of the second charging voltage V_ch2.

The first comparison charging circuit 310 generates the first charging pulse CH_p1 and charges a voltage in the first capacitor C1 during the enable period of the first charging pulse CH_p1, when the first and second sampling signals Sam_1 and Sam_2 have different levels. The first comparison charging circuit 310 does not generate the first charging pulse CH_p1 and does not charge a voltage in the first capacitor C1, when the first and second sampling signals Sam_1 and Sam_2 have the same level. A voltage charged in the first capacitor C1 is outputted as the first charging voltage V_ch1.

The second comparison charging circuit 320 generates the second charging pulse CH_p2 and charges a voltage in the second capacitor C2 during the enable period of the second charging pulse CH_p2, when the second and third sampling signals Sam_2 and Sam_3 have different levels. The second comparison charging circuit 320 does not generate the second charging pulse CH_p2 and does not charge a voltage in the second capacitor C2, when the second and third sampling signals Sam_2 and Sam_3 have the same level. A voltage charged in the second capacitor C2 is outputted as the second charging voltage V_ch2.

The comparison circuit 400 compares the voltage levels of the first and second charging voltages V_ch1 and V_ch2, and generates the result signal R_s. For example, the comparison circuit 400 enables the result signal R_s when the voltage level of the first charging voltage V_ch1 is the higher of the first and second charging voltages V_ch1 and V_ch2. The comparison circuit 400 disables the result signal R_s when the voltage level of the second charging voltage V_ch2 is the higher of the first and second charging voltages V_ch1 and V_ch2.

Figure 4:
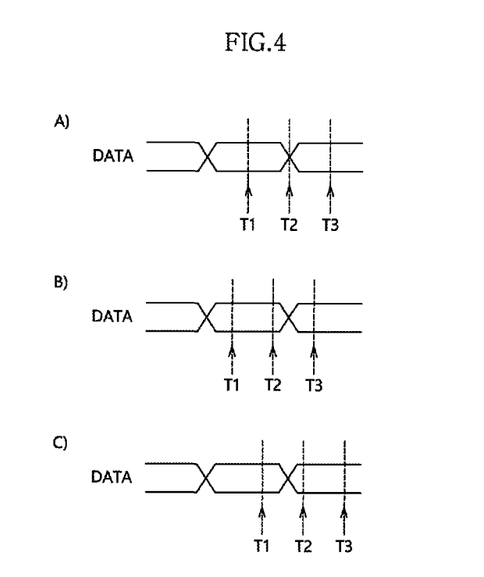
FIG. 4 is a representation of an example timing diagram to assist in explaining operation of the phase detection circuit in accordance with an embodiment.

With reference to FIG. 4, operation of the phase detection circuit in accordance with an embodiment will be summarized below.

A) is a timing diagram illustrating the data DATA inputted normally synchronized with the clock CLK. The first sampling signal Sam_1 is generated by first sampling circuit 210 sampling the data DATA at a first sampling time T1, the second sampling signal Sam_2 is generated by the second sampling circuit 220 sampling the data DATA at a second sampling time T2, and the third sampling signal Sam_3 is generated by third sampling circuit 230 sampling the data DATA at a third sampling time T3. Therefore, the first sampling time T1 is the rising time of the first phase change clock CLK_ph1, the second sampling time T2 is the rising time of the second phase change clock CLK_ph2, and the third sampling time T3 is the rising time of the third phase change clock CLK_ph3.

B) is a timing diagram illustrating the data DATA inputted abnormally synchronized with the clock CLK. In detail, a time at which the data DATA is inputted later than the clock CLK or the phase of the clock CLK is earlier than the phase of the data DATA. Since the same data DATA are sampled at the first and second sampling times T1 and T2, the first and second sampling signals Sam_1 and Sam_2 are signals having the same level. Also, since different data DATA are sampled at the second and third sampling times T2 and T3, the second and third sampling signals Sam_2 and Sam_3 have different levels.

In the case of B), since the first and second sampling signals Sam_1 and Sam_2 are signals having the same level, the first comparison charging circuit 310 does not raise but maintains the voltage level of the first charging voltage V_ch1. Since the second and third sampling signals Sam_2 and Sam_3 have different levels, the second comparison charging circuit 320 raises the voltage level of the second charging voltage V_ch2. Because the voltage level of the second charging voltage V_ch2 becomes higher than the voltage level of the first charging voltage V_ch1, the comparison circuit 400 disables the result signal R_s. As a result, if the result signal R_s is disabled, the phase of the clock CLK may be earlier than the phase of the data DATA.

C) is a timing diagram illustrating the data DATA inputted abnormally synchronized with the clock CLK. In detail, a time at which the data DATA is inputted earlier than the clock CLK or the phase of the clock CLK is later than the phase of the data DATA. Since different data DATA are sampled at the first and second sampling times T1 and T2, the first and second sampling signals Sam_1 and Sam_2 are different signals. Also, since the same data DATA are sampled at the second and third sampling times T2 and T3, the second and third sampling signals Sam_2 and Sam_3 are signals having the same level.

In the case of C), since the first and second sampling signals Sam_1 and Sam_2 are different signals, the first comparison charging circuit 310 raises the voltage level of the first charging voltage V_ch1. Since the second and third sampling signals Sam_2 and Sam_3 are signals having the same level, the second comparison charging circuit 320 does not raise but retains the voltage level of the second charging voltage V_ch2. Because the voltage level of the first charging voltage V_ch1 becomes higher than the voltage level of the second charging voltage V_ch2, the comparison circuit 400 enables the result signal R_s. As a result, if the result signal R_s is enabled, the phase of the clock CLK may be later than the phase of the data DATA.

As is apparent from the above descriptions, the phase detection circuit in accordance with an embodiment may sample data at a plurality of different sampling times, raise the voltage level of one charging voltage between two charging voltages by comparing the sampled data with each other, and determine whether the phase of a clock is earlier or later than data through the comparison of the voltage levels of two charging voltages.

While various embodiments have been described above, it will be understood to those skilled in the art that the embodiments described are examples only. Accordingly, the phase detection circuit described herein should not be limited based on the described embodiments.

The phase detection circuit discussed above (see FIGS. 1-4) are particular useful in the design of memory devices, processors, and computer systems. For example, referring to FIG. 5, a block diagram of a system employing a phase detection circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 5:
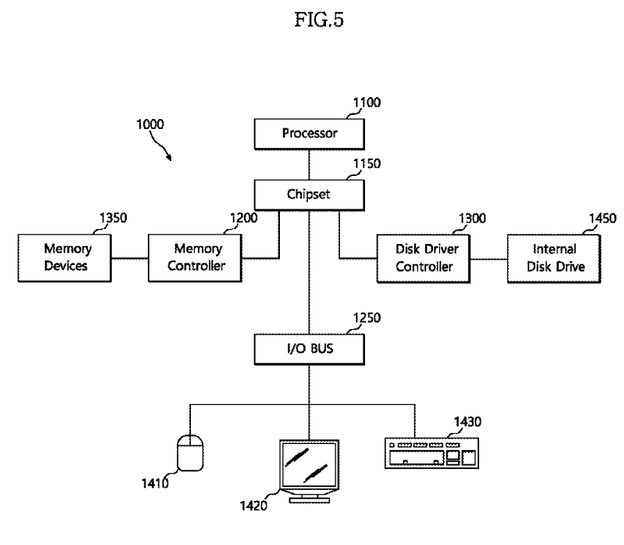
FIG. 5 illustrates a block diagram of an example system employing a phase detection circuit in accordance with the various embodiments discussed above with relation to FIGS. 1-4.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one phase detection circuit as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one phase detection circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a phase detection circuit as discussed above with relation to FIGS. 1-4. In alternate embodiments, such as, for example but not limited to, cellular phones or digital cameras, the components may differ from the embodiments illustrated in FIG. 5.

What is claimed is:

1. A phase detection circuit comprising:
  a sampling signal generation circuit configured to generate a plurality of sampling signals in response to a plurality of phase change clocks having different phases and data;
  a charging voltage generation circuit configured to include capacitors and compare the plurality of sampling signals, and change a voltage level of one charging voltage between a first charging voltage and a second charging voltage; and
  a comparison circuit configured to compare voltage levels of the first and second charging voltages, and generate a result signal,
  wherein the comparison circuit compares the voltage levels of the first and second charging voltages and generates the result signal, each time an update signal is enabled, and wherein the update signal is enabled with a predetermined cycle.

2. The phase detection circuit according to claim 1, further comprising:
  a multiphase clock generation circuit configured to be inputted with a clock, and generate the plurality of phase change clocks.

3. The phase detection circuit according to claim 2, wherein a phase difference between a first phase change clock and a second phase change clock is one fourth of a cycle, and a difference between a second phase change clock and a third phase change clock is one fourth of a cycle.

4. The phase detection circuit according to claim 1, wherein the sampling signal generation circuit comprises a plurality of sampling circuits which are respectively inputted with the plurality of phase change clocks and are inputted in common with the data, and
wherein the sampling circuits generate the plurality of sampling signals, respectively.

5. The phase detection circuit according to claim 1, wherein the plurality of sampling signals comprise a first sampling signal, a second sampling signal and a third sampling signal, and
wherein the charging voltage generation circuit comprises:
a first comparison charging circuit configured to compare the first and second sampling signals, and generate the first charging voltage, and
a second comparison charging circuit configured to compare the second and third sampling signals, and generate the second charging voltage.

6. The phase detection circuit according to claim 5, wherein each of the first and second comparison charging circuits comprises:
a charging pulse generating circuit configured to generate a charging pulse when two sampling signals have different levels; and
a charging circuit configured to charge a voltage in one of the capacitors during an enable period of the charging pulse,
wherein a voltage charged in the capacitor is outputted as a charging voltage.

7. The phase detection circuit according to claim 6, wherein the charging circuit comprises a reset circuit which discharges the capacitor when a reset signal is enabled.

8. The phase detection circuit according to claim 1, wherein the comparison circuit enables the result signal when the voltage level of the first charging voltage is higher than the second charging voltage.

9. The phase detection circuit according to claim 1, wherein the comparison circuit disables the result signal when the voltage level of the second charging voltage is higher than the first charging voltage.

10. A phase detection circuit comprising:
a first sampling circuit configured to sample data at a first sampling time, and output a first sampling signal;
a second sampling circuit configured to sample the data at a second sampling time, and output a second sampling signal;
a third sampling circuit configured to sample the data at a third sampling time, and output a third sampling signal;
a charging voltage generation circuit configured to include capacitors and raise a voltage level of a first charging voltage according to whether the first and second sampling signals are the same or raise a voltage level of a second charging voltage according to whether the second and third sampling signals are the same; and
a comparison circuit configured to compare the voltage levels of the first and second charging voltages, and generate a result signal,
wherein the comparison circuit compares the voltage levels of the first and second charging voltages and generates the result signal, each time an update signal is enabled, and wherein the update signal is enabled with a predetermined cycle.

11. The phase detection circuit according to claim 10, wherein the charging voltage generation circuit comprises:
a first comparison charging circuit configured to determine whether the first and second sampling signals are the same, and generate the first charging voltage, and
a second comparison charging circuit configured to determine whether the second and third sampling signals are the same, and generate the second charging voltage.

12. The phase detection circuit according to claim 11, wherein the first comparison charging circuit comprises:
a charging pulse generating circuit configured to generate a charging pulse when the first and second sampling signals have different levels; and
a charging circuit configured to apply a voltage in a capacitor during an enable period of the charging pulse, and thereby charge the capacitor,
wherein a voltage charged in the capacitor is the first charging voltage.

13. The phase detection circuit according to claim 12, wherein the charging pulse generating circuit comprises:
a sample comparison circuit configured to enable a comparison signal when the first and second sampling signals have different levels; and
a pulse generation circuit configured to generate the charging pulse when the comparison signal is enabled.

14. The phase detection circuit according to claim 11, wherein the second comparison charging circuit comprises:
a charging pulse generating circuit configured to generate a charging pulse when the second and third sampling signals have different levels; and
a charging circuit configured to apply a voltage in a capacitor during an enable period of the charging pulse, and thereby charge the capacitor,
wherein a voltage charged in the capacitor is the second charging voltage.

15. The phase detection circuit according to claim 14, wherein the charging pulse generating circuit comprises:
a sample comparison circuit configured to enable a comparison signal when the second and third sampling signals have different levels; and
a pulse generation circuit configured to generate the charging pulse when the comparison signal is enabled.

16. The phase detection circuit according to claim 1, wherein the first sampling circuit samples the data in response to a first change clock, the second sampling circuit samples the data in response to a second phase change clock, and the third sampling circuit samples the data in response to a third phase change clock.

17. The phase detection circuit according to claim 1, wherein the comparison circuit is configured to generate the result signal based on whether one of the first and second charging voltages is greater.

18. The phase detection circuit according to claim 1, wherein the capacitors are discharged in response to a reset signal.

19. The phase detection circuit according to claim 10, wherein the capacitors are discharged in response to a reset signal.

* * * * *